(12) United States Patent
Shiroya et al.

(10) Patent No.: US 11,703,087 B2
(45) Date of Patent: Jul. 18, 2023

(54) SLIDING MEMBER

(71) Applicant: DAIDO METAL COMPANY LTD., Nagoya (JP)

(72) Inventors: Tomoyasu Shiroya, Inuyama (JP); Hiroki Kobayakawa, Inuyama (JP)

(73) Assignee: DAIDO METAL COMPANY LTD., Nagoya (JP)

( * ) Notice: Subject to any disclaimer, the term of this patent is extended or adjusted under 35 U.S.C. 154(b) by 331 days.

(21) Appl. No.: 16/767,345

(22) PCT Filed: Dec. 25, 2018

(86) PCT No.: PCT/JP2018/047692
§ 371 (c)(1),
(2) Date: May 27, 2020

(87) PCT Pub. No.: WO2019/181132
PCT Pub. Date: Sep. 26, 2019

(65) Prior Publication Data
US 2020/0400191 A1 Dec. 24, 2020

(30) Foreign Application Priority Data
Mar. 22, 2018 (JP) .................. 2018-055378

(51) Int. Cl.
*F16C 33/24* (2006.01)
*C22C 21/00* (2006.01)
(Continued)

(52) U.S. Cl.
CPC ............. *F16C 33/24* (2013.01); *C22C 21/00* (2013.01); *C23C 14/06* (2013.01); *F16C 33/10* (2013.01)

(58) Field of Classification Search
None
See application file for complete search history.

(56) References Cited

U.S. PATENT DOCUMENTS 3,410,331 A    11/1968   Miller et al.
3,545,943 A * 12/1970   Miller .................. B22D 11/143
                                                                   428/547

(Continued)

FOREIGN PATENT DOCUMENTS

DE   102007043941 B3   1/2009
JP      S54-103752 A    8/1979
(Continued)

OTHER PUBLICATIONS

International Search Report issued in corresponding International Application No. PCT/JP2018/04692 dated Mar. 12, 2019.

*Primary Examiner* — Seth Dumbris
(74) *Attorney, Agent, or Firm* — Snyder, Clark, Lesch & Chung, LLP

(57) ABSTRACT

Disclosed herein is a sliding member having an alloy overlay layer that comes into sliding contact with a counterpart member thereof and has improved fatigue resistance. The sliding member comprises a base material layer and an alloy overlay layer formed on the base material layer, in which the alloy overlay layer has a soft metal phase made of tin and precipitated in a metallic matrix phase made of aluminum, and when an average aspect ratio of the soft metal phase is defined as A, and its standard deviation is defined as Aσ, A+Aσ is 3.0 or less. In this case, the soft metal phase has a shape close to a sphere without elongating in a certain direction.

3 Claims, 7 Drawing Sheets

(51) Int. Cl.
   *C23C 14/06*      (2006.01)
   *F16C 33/10*      (2006.01)

(56) References Cited

U.S. PATENT DOCUMENTS

| | | | | |
|---|---|---|---|---|
| 4,475,983 A | * | 10/1984 | Bader | H01H 1/025 |
| | | | | 216/75 |
| 5,242,717 A | | 9/1993 | Tanaka | |
| 6,143,427 A | | 11/2000 | Andler | |
| 7,572,521 B2 | | 8/2009 | Mergen et al. | |
| 2006/0029827 A1 | | 2/2006 | Mergen et al. | |
| 2009/0246072 A1 | | 10/2009 | Nirasawa et al. | |
| 2010/0221141 A1 | * | 9/2010 | Tonn | C22F 1/053 |
| | | | | 164/76.1 |
| 2017/0350449 A1 | | 12/2017 | Matsumoto et al. | |

FOREIGN PATENT DOCUMENTS

| | | |
|---|---|---|
| JP | 2000-513765 A | 10/2000 |
| JP | 2006-45677 A | 2/2006 |
| JP | 2009-228100 A | 10/2009 |
| JP | 2017-179497 A | 10/2017 |

\* cited by examiner

SLIDING MEMBER

TECHNICAL FIELD

The present invention relates to a sliding member. More specifically, the present invention relates to improvement of a sliding member having an alloy overlay layer whose matrix phase is a metal such as aluminum.

BACKGROUND ART

An aluminum alloy layer disclosed in Patent Document 1 is known as an example of an alloy overlay layer.

In this alloy overlay layer, a hard phase made of silicon or the like and a soft metal phase made of tin, lead, or the like are present as precipitated phases in a matrix phase made of aluminum. The control of the size of this soft metal phase (miniaturization) and coexistence of this soft metal phase and the hard phase improve the strength of the overlay layer, and therefore the overlay layer can surely have high wear resistance.

Such an alloy overlay layer is generally formed by sputtering. This is because the use of sputtering (e.g., DC magnetron sputtering) makes it possible to obtain a stable layer composition while reducing production costs.

The use of another vapor deposition method such as PVD has also been proposed.

CITATIONS LIST

Patent Document

Patent Document 1: JP 2006-45677 A

SUMMARY OF INVENTION

Technical Problems

The present inventors have found the following problem when an alloy overlay layer is formed by sputtering, particularly when a soft metal phase made of tin or the like is precipitated in a matrix phase made of aluminum or the like.

More specifically, it has been often seen that particles of the soft metal phase to be precipitated are coupled together by agglomeration in the matrix phase so that the soft metal phase elongates in a certain direction. When particles of the soft metal phase that should originally be miniaturized are coupled together so that the soft metal phase elongates, the soft metal phase has a shape like a so-called knife. Therefore, when a load is applied to the alloy overlay layer, the stress of the alloy overlay layer is concentrated on knife-shaped portions, which limits the strength of the alloy overlay layer. Current sliding members are required to have higher fatigue resistance, and therefore such a limitation of strength may interfere with the improvement of fatigue resistance.

Solutions to Problems

Under the above circumstances, the present inventors have intensively studied to improve the fatigue resistance of an alloy overlay layer. As a result, the present inventors have conceived the following aspects of the present invention.

A first aspect of the present invention is defined as follows. That is, a sliding member comprising: a base material layer; and an alloy overlay layer formed on the base material layer, in which the alloy overlay layer has a soft metal phase precipitated in a metallic matrix phase, and when an average aspect ratio of the soft metal phase is defined as A and its standard deviation is defined as A$\sigma$, A+A$\sigma$ is 3.0 or less.

In the sliding member according to the first aspect defined above, the soft metal phase does not have a shape elongating in a certain direction but has a shape close to a sphere. When a load is applied to the alloy overlay layer, stress is evenly applied to such a soft metal phase having a shape close to a sphere and is therefore distributed. Therefore, the alloy overlay layer can surely have high mechanical strength, which improves the fatigue resistance of the alloy overlay layer.

A second aspect of the present invention is defined as follows. In the sliding member according to the first aspect, when a standard deviation of areas of Voronoi polygons of the soft metal phase obtained by processing a cross-sectional image of the alloy overlay layer is defined as B$\sigma$, the B$\sigma$ is 0.80 $\mu m^2$ or less.

When Voronoi polygons are uniform in area, generating points in a certain region are spaced uniformly. That is, dispersibility is excellent. According to the second aspect, when the cross-sectional image of the alloy overlay layer is processed to form Voronoi polygons using particles of the soft metal phase in the image as generating points, the standard deviation B$\sigma$ of areas of the obtained Voronoi polygons is 0.80 $\mu m^2$ or less. When the alloy overlay layer has such a small deviation B$\sigma$ of areas of Voronoi polygons, that is, when the soft metal phase is uniformly dispersed in the alloy overlay layer, the soft metal phase is uniformly exposed also at the surface of the alloy overlay layer. As a result, when a counterpart member thereof comes into sliding contact with the alloy overlay layer, the soft metal phase uniformly comes into contact with the entire surface of the counterpart member. Further, as compared with a case where the soft metal phase is ununiformly dispersed (i.e., particles of the soft metal phase form lumps), the area of contact between the soft metal phase and the counterpart member increases.

When the soft metal phase exposed at the surface of the alloy overlay layer comes into sliding contact with the counterpart member, its contact surface instantaneously has high temperature and melts. A melted soft metal functions as a lubricant, and therefore after that, an increase in the temperature of the contact surface is prevented. This prevents an increase in the temperature of the alloy overlay layer itself, thereby preventing a reduction in the hardness of the alloy overlay layer. Therefore, the mechanical strength of the alloy overlay layer is kept, and a reduction in fatigue resistance is prevented. According to the second aspect of the present invention, the area of the soft metal phase exposed at the surface of the alloy overlay layer increases, and therefore the function of the soft metal phase as a lubricant is enhanced.

Further, when the soft metal phase is uniformly dispersed, concentration of stress of the alloy overlay layer, generated by application of a load to the alloy overlay layer, on the soft metal phase is relieved. Therefore, combined with the requirement defined as the first aspect (spheronization of the soft metal phase), the alloy overlay layer can surely have a higher mechanical strength, thereby further improving the fatigue resistance of the alloy overlay layer.

A third aspect of the present invention is defined as follows. In the sliding member according to the first or second aspect, when an average particle diameter of the soft metal phase is defined as C, and its standard deviation is defined as Cσ, C+Cσ is 0.70 μm or less.

In the sliding member according to the third aspect defined above, the average particle diameter of the soft metal phase is as small as C+Cσ≤0.70 μm. The soft metal phase is precipitated at the crystal grain boundary of the matrix phase, and therefore a reduction in the particle diameter of the soft metal phase means a reduction in the crystal grain size of the matrix phase. Therefore, the mechanical strength of the matrix phase increases according to the law of Hall-Petch so that the mechanical strength of the alloy overlay layer increases. Therefore, the alloy overlay layer can surely have high fatigue resistance.

A fourth aspect of the present invention is defined as follows. In the sliding member according to any one of the first to third aspects, the matrix phase is preferably made of aluminum, copper, or an alloy of them, and the soft metal phase is preferably made of at least one of tin, lead, and bismuth.

In the sliding member according to the fourth aspect defined above, a material or a combination of materials forming each of the phases is appropriately selected, and therefore the alloy overlay layer is suitable for a sliding member for vehicles or the like for use in a severe environment.

BRIEF DESCRIPTION OF DRAWINGS

FIGS. 2A to 2D are schematic diagrams for explaining the aspect ratio properties of a soft metal phase, in which FIG. 2A is a cross-sectional image of an alloy overlay layer satisfying the requirement specified in the first aspect.

FIG. 2B is a histogram showing the aspect ratio distribution of a soft metal phase appearing in the cross-sectional image.

FIG. 2C is a cross-sectional image of an alloy overlay layer not satisfying the requirement specified in the first aspect.

FIG. 2D is a histogram showing the aspect ratio distribution of a soft metal phase appearing in the cross-sectional image.

FIGS. 4A to 4D are schematic diagrams for explaining properties based on the standard deviation of areas of Voronoi polygons, in which FIG. 4A is a cross-sectional image of an alloy overlay layer satisfying the requirement specified in the second aspect.

FIG. 4B is a histogram showing the distribution of areas of Voronoi polygons of a soft metal phase appearing in the cross-sectional image.

FIG. 4C is a cross-sectional image of an alloy overlay layer not satisfying the requirement specified in the second aspect.

FIG. 4D is a histogram showing the distribution of areas of Voronoi polygons of a soft metal phase appearing in the cross-sectional image.

FIGS. 5A and 5B are schematic diagrams showing the average particle diameter properties of a soft metal phase, in which FIG. 5A is a histogram showing the distribution of particle diameter of a soft metal phase determined from the cross-sectional image of an alloy overlay layer satisfying the requirement specified in the third aspect.

FIG. 5B is a histogram showing the distribution of particle diameter of a soft metal phase determined from the cross-sectional image of an alloy overlay layer not satisfying the requirement specified in the third aspect.

DESCRIPTION OF EMBODIMENTS

Hereinafter, the present invention will be described in detail on the basis of embodiments.

Figure 1:
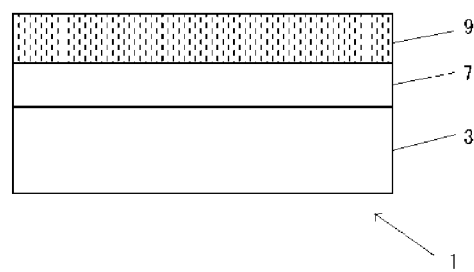
FIG. 1 is a sectional view showing a sliding member according to a first embodiment of the present invention.

FIG. 1 shows the layer structure of a slide bearing 1 as a sliding member according to a first embodiment of the present invention.

The slide bearing 1 includes a back metal layer 3 as a base material layer, a bearing alloy layer 7, and an alloy overlay layer 9.

The back metal layer 3 is formed of a steel plate formed into a cylindrical or semi-cylindrical shape. On the upper surface of the back metal layer 3, the bearing alloy layer 7 made of an alloy of Al, Cu, Sn, etc. is laminated by a method such as sintering, casting, or pressure welding.

In order to improve adhesion between the bearing alloy layer 7 and the alloy overlay layer 9, the bearing alloy layer 7 is preferably subjected to surface treatment. A method used for the surface treatment may be, for example, ion milling such as argon bombardment.

Figure 2A:
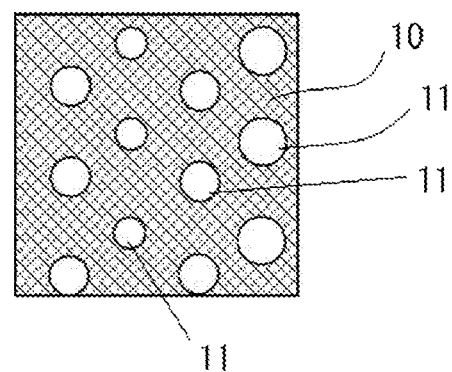

As shown in FIG. 2A, the alloy overlay layer 9 is formed by dispersing a soft metal phase 11 in a matrix phase 10.

As the matrix phase 10, aluminum, copper, or an alloy thereof may be used.

A hard phase made of silicon or the like may be used in combination with the soft metal phase 11.

The soft metal phase 11 may be made of a metallic material having a hardness equal to or lower than that of the metallic material of the matrix phase and a melting point lower than that of the metallic material of the matrix phase. Examples of such a metallic material include tin, lead, and bismuth.

The percentage of the amount of the soft metal phase to the amount of the matrix phase can appropriately be selected depending on the intended use of the sliding member, but is, for example, 10 wt. % to 40 wt. %.

The film thickness of the alloy overlay layer 9 can also be appropriately selected depending on the intended use of the sliding member, but is, for example, 5 to 40 μm.

When an average aspect ratio of the soft metal phase 11 is defined as A and its standard deviation is defined as Aσ, A+Aσ is 3.0 or less.

Here, an aspect ratio can be determined in the following manner.

The alloy overlay layer 9 is cut in its thickness direction, and an image of the cutting surface is taken with an electron microscope. The obtained image is analyzed to extract corresponding ellipses of the soft metal phase. All the corresponding ellipses within a predetermined region (e.g., 10×10 μm) in the processed image are extracted, and the aspect ratio b/a of each of the corresponding ellipses is calculated, wherein a and b represent the minor axis and major axis of the corresponding ellipse, respectively. An average aspect ratio A and a standard deviation Aσ are calculated from the aspect ratios of all the extracted ellipses.

In the present invention, the sum of the average aspect ratio A and the standard deviation Aσ is 3.0 or less. Preferably, the sum is 2.0 or less.

Figure 2B:
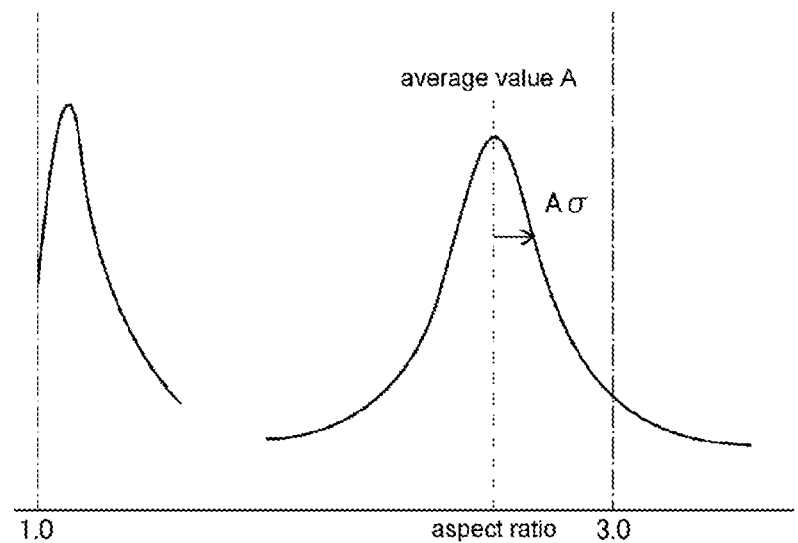

FIG. 2B shows an example of a histogram obtained when the sum of the average aspect ratio A and the standard deviation Aσ is 3.0 or less. As shown in the drawing, the histogram obtained when A+Aσ≤3.0 corresponds to a bimodal histogram. In either case, the aspect ratio distribution is narrow. Therefore, the soft metal phase 11 in the matrix phase 10 has a shape close to a sphere.

Figure 2C:
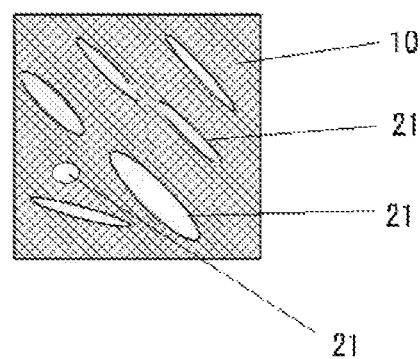

When particles of a soft metal are coupled together so that a soft metal phase elongates in a certain direction as in the case of a conventional alloy overlay layer (see FIG. 2C), $A+A\sigma > 3.0$. It is to be noted that a histogram obtained when $A+A\sigma > 3.0$ corresponds to a bimodal histogram (see FIG. 2D). In either case, many particles of a soft metal phase 21 having a large aspect ratio are contained. When such a soft metal phase elongating in a certain direction is present, the stress of a matrix phase concentrates on knife-shaped portions of the soft metal phase, which is not preferred as has been described above.

Figure 3:
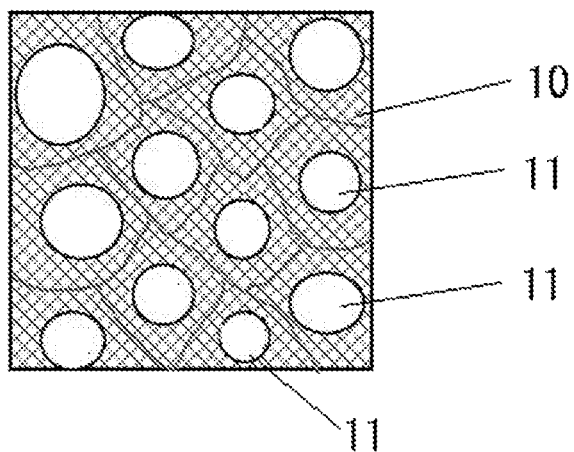
FIG. 3 is an illustration for explaining Voronoi polygons.

FIG. 3 shows the result of a Voronoi polygon tessellation using the centroids of the soft metal phase 11 as centers. This processing is performed by versatile image processing software, and the area of each Voronoi polygon is also calculated. Then, a standard deviation $B\sigma$ of areas of all the Voronoi polygons obtained in a predetermined image region is calculated.

In this invention, the standard deviation $B\sigma$ is 0.80 $\mu m^2$ or less. The value of $B\sigma$ is preferably 0.45 $\mu m^2$ or less.

When the standard deviation of areas of Voronoi polygons is such a small value, the distances between centroids of particles of the soft metal phase 11 are uniform. That is, the soft metal phase is uniformly dispersed in the matrix phase.

Figure 4A:
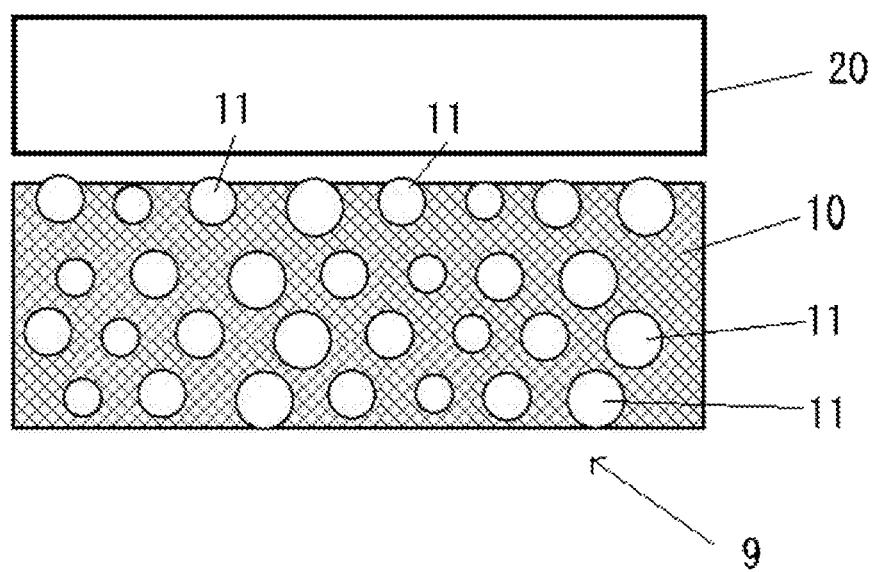
Figure 4B:
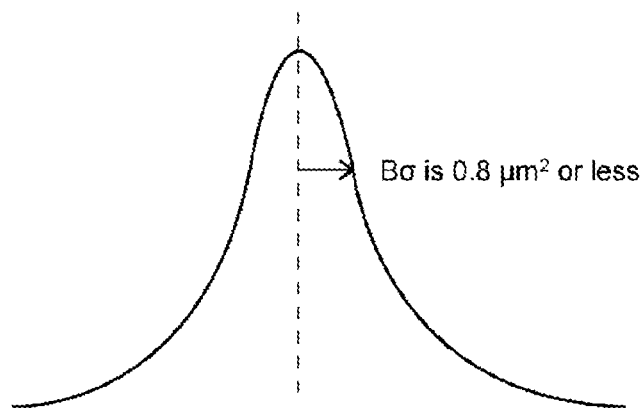

FIG. 4A shows a state where the soft metal phase 11 (which has a shape close to a sphere) is uniformly dispersed in the matrix phase 10. FIG. 4B is a histogram of areas of Voronoi polygons in this case.

Figure 4C:
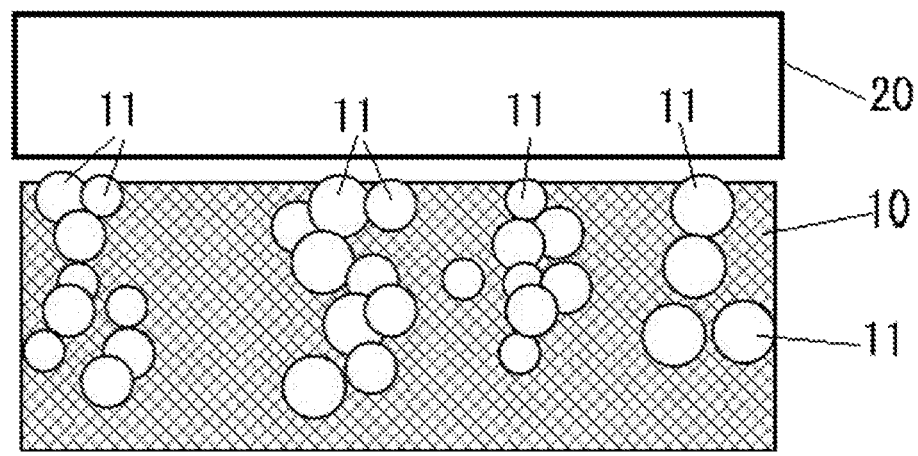
Figure 4D:
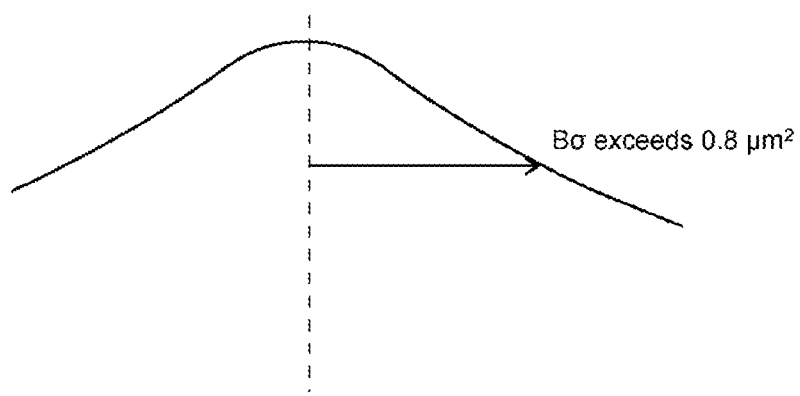

On the other hand, FIG. 4C schematically shows how particles of the soft metal phase 11 are dispersed (particles of the soft metal phase 11 are agglomerated) when the standard deviation of a histogram of areas B of Voronoi polygons exceeds 0.80 $\mu m^2$. The histogram of areas of Voronoi polygons in this case is shown in FIG. 4D. The reference sign 20 shown in FIGS. 4A and 4C denotes a counterpart member that comes into sliding contact with the sliding member.

The comparison between FIG. 4A and FIG. 4C reveals that the soft metal phase 11 exposed at the surface of the alloy overlay layer 9 can surely have a larger area in the former case. Particularly, when the soft metal phase has a shape close to a sphere, the area of the soft metal phase exposed at the surface of the alloy overlay layer 9 is proportional to the number of particles of the soft metal phase exposed at the surface of the alloy overlay layer 9, and therefore the area of the soft metal exposed at the surface of the alloy overlay layer 9 can be maximized by achieving high dispersibility as shown in FIG. 4A.

Further, the stress of the matrix phase 10 is uniformly distributed to the soft metal phase 11, and therefore the alloy overlay layer 9 can have stable mechanical strength over the entire region thereof, that is, the alloy overlay layer 9 has no fragile portions. As a result, the alloy overlay layer 9 has increased mechanical strength.

In the cross-sectional image obtained in such a manner as described above, the length of a line connecting two points on the outer periphery of a particle of the soft metal phase and passing through the centroid of the particle is measured at intervals of 2° as a diameter. From the averages of the thus measured diameters, an average particle diameter C and its standard deviation $C\sigma$ are calculated.

In this invention, the sum of the average particle diameter C and its standard deviation $C\sigma$ is 0.70 $\mu m$ or less. Preferably, the sum is 0.55 $\mu m$ or less.

Figure 5A:
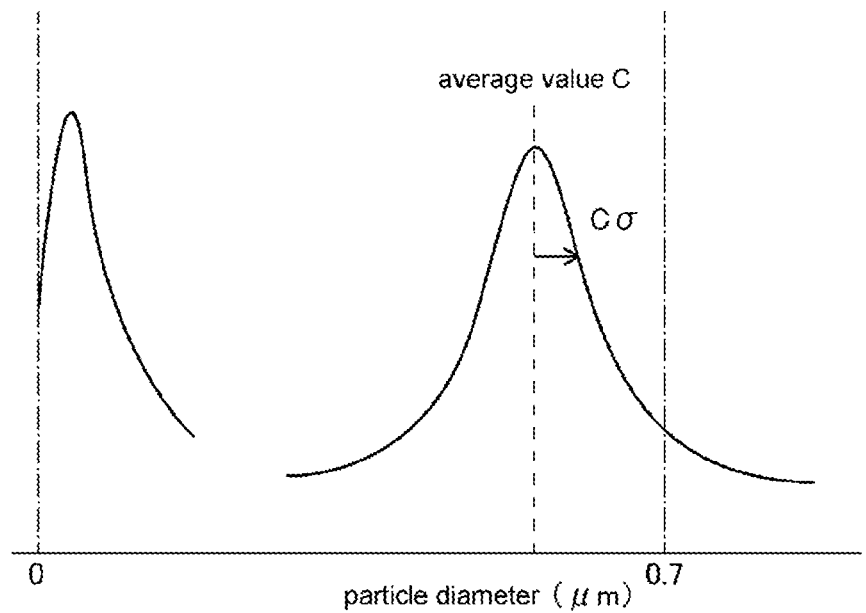
Figure 5B:
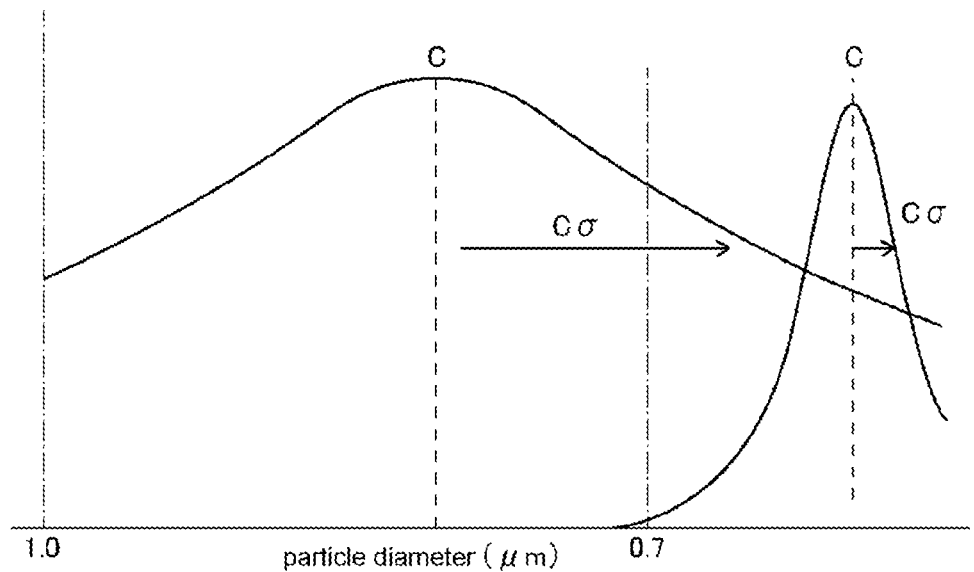

FIG. 5A shows an example of a histogram obtained when the sum of the average particle diameter C and the standard deviation $C\sigma$ is 0.7 $\mu m$ or less. As shown in the drawing, the histogram obtained when $C+C\sigma \leq 0.70$ $\mu m$ corresponds to a bimodal histogram. In either case, the average particle diameter is small. Therefore, the alloy overlay layer has improved mechanical strength due to the Hall-Petch effect so that high fatigue resistance is imparted to the alloy overlay layer.

Figure 2D:
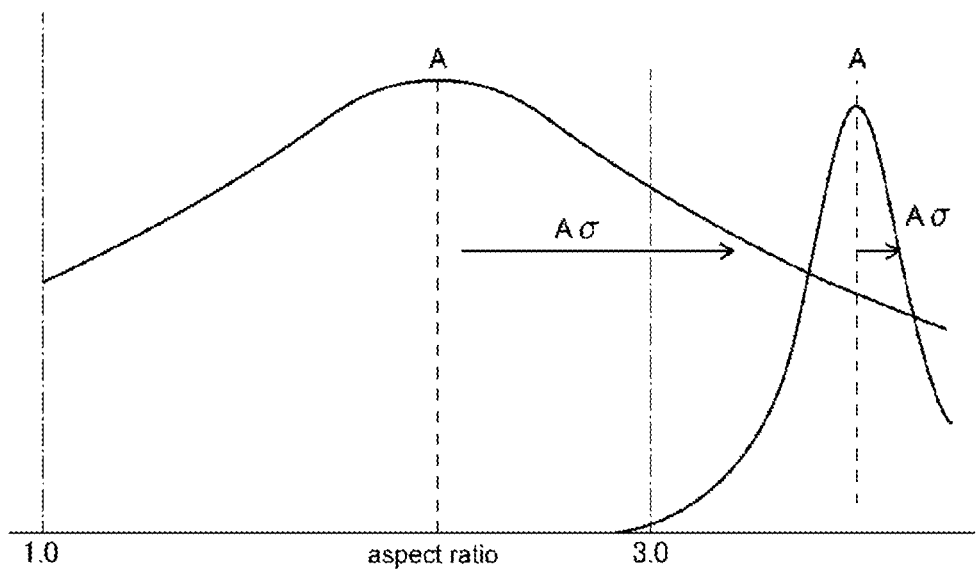

On the other hand, a histogram obtained when this requirement is not satisfied, that is, $C+C\sigma > 0.70$ $\mu m$ corresponds to a bimodal histogram (see FIG. 2D). In either case, many particles of the soft metal phase 21 having a large particle diameter are contained.

Particles of the soft metal phase precipitated in the matrix phase have a shape close to a sphere due to surface tension when the particles themselves are individually present. Therefore, the soft metal phase can have a shape close to a sphere by preventing particles of the soft metal phase from being coupled together during precipitation. Studies by the present inventors have revealed that coupling of particles of the soft metal phase can be prevented by increasing the speed of forming a film as the alloy overlay layer 9 to some extent (e.g., 15 $\mu m$/min). Further, when a thermal history is given during and after the formation of a film as the alloy overlay layer 9, there is also a fear that particles of the soft metal phase having a melting point lower than that of the matrix are coupled together.

From such a viewpoint, electron beam evaporation or boat heating evaporation achieving a high film-forming speed can be used as a method for forming a film as the alloy overlay layer 9 in which the soft metal phase having a shape close to a sphere is dispersed in the matrix phase. However, in order to reduce the influence of radiant heat from a heat source (i.e., thermal history during and after film formation), the shape of a boat-type heat source is preferably adjusted so that a virtual normal line of the surface thereof does not intersect with a workpiece. This is to prevent the workpiece from being directly irradiated with radiant heat of the heat source during film formation to prevent an excessive thermal history from being given to the workpiece.

When the alloy overlay layer is produced in such a manner as described above, coupling of particles of the soft metal phase can be prevented. In addition to that, particularly, high dispersion and miniaturization of the particles in the soft metal phase can also be achieved by increasing the film-forming speed.

EXAMPLES

Hereinbelow, examples will be described.

Slide bearings of Examples and Comparative Examples were formed in the following manner.

A so-called bimetal was produced by forming a Cu-based bearing alloy layer 7 as a lining on a steel back metal layer 3. This bimetal was formed into a semi-cylindrical shape, and the surface of the bearing alloy layer 7 was subjected to boring and surface finishing.

Then, argon bombardment was performed as a pretreatment before an alloy overlay layer 9 was formed.

A film was formed as an alloy overlay layer on the thus obtained workpiece by boat heating evaporation. The following conditions for film formation were common to Examples and Comparative Examples.

(Evaporation Material)

An evaporation material was an aluminum tin alloy, and the aluminum tin alloy had a composition of Al:Sn=75:25 (mass %).

(Evaporation Source Temperature)

An evaporation source temperature was 1300° C.

(Ambient Pressure)

An ambient pressure was $5.0 \times 10^{-3}$ Pa.

(Temperature of Workpiece)

Examples 1 and 2: 170 to 190° C.

Examples 3 and 4: 140 to 160° C.

Examples 5 and 6: 70 to 90° C.

Comparative Examples 1 and 2: 240 to 260° C.

It has been found that the temperature of the workpiece has a great influence on the profile of soft metal phase of the alloy overlay layer.

Results are shown in Table 1.

TABLE 1

| | Aspect ratio property (μm) | | | Dispersibility property | Average particle diameter property (μm) | | | Evaluation of fatigue resistance (Mpa) |
|---|---|---|---|---|---|---|---|---|
| | A | Aσ | A + Aσ | (μm²) Bσ | C | Cσ | C + Cσ | |
| Example 1 | 2.5 | 0.5 | 3.0 | 1.25 | 0.70 | 0.28 | 0.98 | 130 |
| Example 2 | 0.4 | 1.6 | 2.0 | 1.15 | 0.90 | 0.25 | 1.25 | 130 |
| Example 3 | 1.5 | 0.5 | 1.8 | 0.80 | 0.80 | 0.30 | 1.20 | 150 |
| Example 4 | 1.5 | 0.5 | 1.8 | 0.45 | 0.25 | 0.90 | 1.15 | 150 |
| Example 5 | 1.5 | 0.5 | 1.8 | 0.45 | 0.40 | 0.30 | 0.70 | 170 |
| Example 6 | 1.5 | 0.5 | 1.8 | 0.45 | 0.25 | 0.30 | 0.55 | 170 |
| Comparative Example 1 | 3.0 | 0.5 | 4.0 | 2.00 | 0.70 | 0.30 | 1.00 | 110 |
| Comparative Example 2 | 1.5 | 2.5 | 4.0 | 2.00 | 0.80 | 0.20 | 1.00 | 110 |
| Comparative Example 3 | 3.0 | 2.5 | 5.8 | 2.30 | 1.00 | 0.90 | 1.90 | 110 |

It is to be noted that in Comparative Example 3, the alloy overlay layer was formed by sputtering at a low film-forming speed in accordance with a conventional example. An AlSn alloy (75:25 wt. %) was used as a sputtering source, and the temperature of the workpiece was 140° C.

A fatigue resistance test was performed in the following manner.

A bearing used as a sliding member in each of Examples and Comparative Examples had a width of 15 mm, an outer diameter of 55 mm, and a thickness of 1.5 mm Here, the thickness of the alloy overlay layer was 15 μm.

As a counterpart member of the bearing, a rotary shaft made of high-carbon steel (S55C) was selected. The rotary shaft was rotated for 20 hours at a rotation speed of 3250 rpm while a predetermined surface pressure was applied thereto and oil was supplied at a temperature of 100° C. After the completion of the test, the alloy overlay layer of the sliding member was visually observed to determine whether or not cracking had occurred.

The above-described surface load applied to the rotary shaft was increased by 10 MPa increments from 100 MPa. Fatigue resistance was evaluated on the basis of the maximum surface pressure before the occurrence of cracking in the alloy overlay layer.

The properties of the soft metal phase of the alloy overlay layer (aspect ratio property, dispersibility property, average particle diameter property) were determined in the following manner.

The bearing of each of Examples and Comparative Examples was cut with a wet cutter in its axis direction, and the image of cross-section of the alloy overlay layer 9 was taken with an electron microscope. The obtained image was processed by imaging software "Image-Pro" manufactured by Media Cybernetics to determine an average aspect ratio A, its standard deviation Aσ, a standard deviation Bσ of areas of Voronoi polygons, an average particle diameter C, and its standard deviation C. It is to be noted that the size of region of the image to be processed was 10 μm×10 μm.

The present invention is not limited to the description of the above embodiment. The present invention also includes various modified embodiments readily conceivable by those skilled in the art without departing from the scope of the claims. A bearing mechanism-using apparatus, such as an internal-combustion engine, using the sliding member according to the present invention exhibits excellent sliding properties.

The above embodiment has been described with reference to a case where a slide bearing is used as a sliding member, but the present invention can be applied also to other sliding members such as plate-shaped thrust washers.

REFERENCE SIGNS LIST

1 Sliding member
3 Back metal layer
7 Bearing alloy layer
9 Alloy overlay layer
10 Matrix phase
11, 21 Soft metal phase
20 Counterpart member

The invention claimed is:

1. A sliding member comprising:
a base material layer; and
an alloy overlay layer formed on the base material layer, wherein
the alloy overlay layer has a soft metal phase precipitated in a metallic matrix phase, and
when an average aspect ratio of the soft metal phase is defined as A, and its standard deviation is defined as Aσ, A+Aσ is 3.0 or less; and
when an average particle diameter of the soft metal phase is defined as C, and its standard deviation is defined as Cσ, C+Cσ is 0.70 μm or less, and
wherein a film thickness of the alloy overlay layer is in a range of 5 through 40 μm.

2. The sliding member according to claim 1, wherein when a standard deviation of areas of Voronoi polygons of the soft metal phase obtained by processing a cross-sectional image of the alloy overlay layer is defined as Bσ, the Bσ is 0.80 μm² or less.

3. The sliding member according to claim 1, wherein the matrix phase is selected from aluminum, copper, and an alloy thereof, and the soft metal phase is at least one selected from tin, lead, and bismuth.

* * * * *